United States Patent

Heeks et al.

[11] Patent Number: 5,965,901
[45] Date of Patent: Oct. 12, 1999

[54] ELECTROLUMINESCENT DEVICES WITH VOLTAGE DRIVE SCHEME

[75] Inventors: Stephen Karl Heeks; Hermann Felix Wittmann, both of Cambridge, United Kingdom

[73] Assignee: Cambridge Display Technology Ltd., Cambridge, United Kingdom

[21] Appl. No.: 08/978,989

[22] Filed: Nov. 26, 1997

[30] Foreign Application Priority Data

Nov. 28, 1996 [GB] United Kingdom ............. 9624706

[51] Int. Cl.[6] .................................................. H01L 33/00
[52] U.S. Cl. ............................ 257/40; 257/79; 257/99; 257/103; 307/117
[58] Field of Search ................... 257/103, 99, 79, 257/40; 307/117

[56] References Cited

U.S. PATENT DOCUMENTS

| | | | |
|---|---|---|---|
| 4,539,507 | 9/1985 | VanSlyke et al. | 315/504 |
| 5,247,190 | 9/1993 | Friend et al. | 257/40 |
| 5,552,678 | 9/1996 | Tang et al. | 315/169.3 |
| 5,684,368 | 11/1997 | Wei et al. | 315/302 |
| 5,748,160 | 5/1998 | Shieh et al. | 345/82 |
| 5,793,163 | 8/1998 | Okuda | 315/169.2 |
| 5,828,181 | 10/1998 | Okuda | 315/169.3 |

FOREIGN PATENT DOCUMENTS 0 686 662 A2  4/1995  European Pat. Off. .

OTHER PUBLICATIONS

S.A. Van Slyke, C.H.Chen, ad C.W. Tang; "Organic electrolumnescent devices with improved stability"; *Appl. Phys. Lett.*; Oct. 7, 1996; pp. 2160–2162.

S.K. Heeks, A. Mosley, B.M. Nicholas, P.C. Rundle, P. Schulusche; "Large Area Ferroelectric Liquid Crystal Displays"; *Ferroelectrics*; 1991; vol. 122, pp. 27–35.

S.K. Heeks, A. Mosley, B.M. Nicholas, P. Shulusche; "The Development of Large–Area Ferroelectric Dot–Matrix Displays"; *SID 91 Digest*; 1991; pp. 404–407.

Bayer AG's Provisional Product Information Sheet for Trial Product AI 4071, Sep. 1995.

*Primary Examiner*—William Mintel
*Attorney, Agent, or Firm*—Merchant & Gould P.C.

[57] ABSTRACT

A light-emissive polymer device comprising: an anode; a cathode; a conjugated light-emissive polymer layer located between the anode and the cathode; and a driver for applying a voltage drive scheme between the anode and the cathode of a pattern having a relatively high voltage portion which causes the polymer layer to emit light and a relatively low voltage portion during which substantially no light is emitted by the polymer layer.

22 Claims, 5 Drawing Sheets

LIGHT OUTPUT

ELECTROLUMINESCENT DEVICES WITH VOLTAGE DRIVE SCHEME

BACKGROUND OF THE INVENTION

This invention relates to electroluminescent devices, and especially to controlling such devices.

One type of electroluminescent device is described in U.S. Pat. No. 5,247,190, the contents of which are incorporated herein by reference. The basic structure of this device is an organic light-emitting polymer film (for instance a film of a poly(p-phenylenevinylene)- "PPV") sandwiched between two electrodes, one of which injects electrons and the other of which injects holes. The electrons and holes excite the polymer film, emitting photons. These devices have potential as flat panel displays.

Another type of organic light-emitting device is a small molecule device, details of which are given in U.S. Pat. No. 4,539,507. These have a light emitting layer of a small molecule material sandwiched between the two electrodes.

Figure 1:
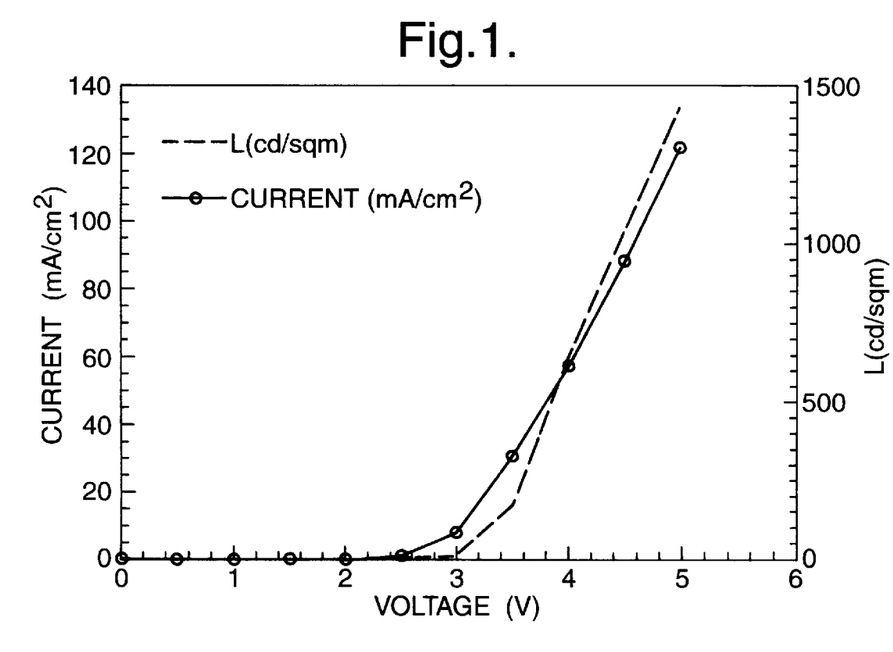
FIG. 1 shows a typical plot of light output against current density and voltage for a light-emitting polymer device.

FIG. 1 shows a typical plot of light output against current arid voltage for a light-emitting polymer device. Such devices typically emit light at relatively low voltages (typical turn-on voltages are below 3V). This makes them suitable for simple battery-driven DC drive schemes. However, the devices often have relatively short lives because they degrade during use.

Intermittent drive schemes are used for LCD matrix displays. Typically, the electrode on one side of the display is patterned into rows and the electrode on the other side is patterned into columns. When a suitable voltage is applied to one row and one column light emission occurs where the two strips overlap. Thus, the points of overlap between the column strips and the row strips define the pixels of the display. A multiplexed drive scheme is often used, in which each row is addressed in turn (by scanning the row electrode strips sequentially) and the appropriate data is applied to the column electrode strips to apply data to the pixels of that row. Clearly, the functions of the rows and columns can be reversed; however, for clarity, in this document the convention described above will be maintained. The multiplexed scheme means that each pixel only receives a voltage for a fraction of the time that the display is in use. The fraction is related to the number of rows in the display: if the display has 500 rows then each pixel will be driven for 1/500 of the time that the display is in use.

U.S. Pat. No. 5,552,678 and Van Slyke et al., Appl. Phys. Lett. 69, 2160 (1996) have described the application of a basic AC drive scheme to an organic small molecule light-emitting device for increasing lifetime due to "catastrophic failure". The degradation mechanisms in the case of small molecule devices are very different from the degradation mechanisms in light emitting polymer devices, for instance because the cause of degradation in small molecules is that they are prongs to re-crystallisation, whereas polymers are not prone to re-crystallisation. Also, the chemical interactions of polymers and small molecules with interfaces in the device structure are very specific and different in the two cases. And the drive voltages used for polymer devices are generally much lower than those used for small molecule devices, which influences their degradation due to electric fields.

Heeks et al., Ferroelectrics 1991 vol. 27, p381 and Heeks et al., SID Digest 91 p404 have described other drive schemes in non-luminescent devices, for example ferroelectric liquid crystal displays. However, up to now there have been no proposals for advanced drive schemes for light-emitting polymer devices.

According to the present invention from one aspect there is provided a light-missive polymer device comprising: an anode; a cathode: a conjugated light-emissive polymer layer located between the anode and the cathode; and a driver for applying a voltage drive scheme between the anode and the cathode of a pattern having relatively high voltage portion which causes the polymer layer to emit light and a relatively low voltage portion during which substantially no light is emitted by the polymer layer.

As will be discussed in more detail below, the applicant has found that a drive scheme of this type has provided surprising increases in the lifetime of conjugated light-emissive polymer devices compared to conventional constant current or constant voltage drive schemes, for the same overall fight output.

According to the present invention from a second aspect there is provided an organic light-emissive device comprising: an anode; a cathode; an organic light-emissive layer located between the anode and the cathode; and a driver for applying a voltage drive scheme between the anode and the cathode of a pattern having a positive voltage portion which causes the organic layer to emit light, a negative voltage portion during which substantially no light is emitted by the organic layer, and a portion of substantially zero voltage during which substantially no light is emitted by the organic layer.

According to the present invention from a third aspect there is provided the use, for the purpose of extending the operating life time of a light-emissive polymer device having a light-emissive layer comprising a conjugated light-emissive polymer material, of a cyclical drive scheme in which a positive voltage sufficient to cause the polymer layer to emit light is applied for only part of the cycle.

The relatively high voltage portion suitably provides a positive voltage. The voltage of the relatively high voltage portion may suitably be at least 1.5, 2, 2.5 or 3 times the turn-on voltage of the polymer layer, preferably in the range from 1.01 to 100 times the turn-on voltage of the polymer layer and most preferably in the range from 2 to 8 times the turn-on voltage. The turn-on voltage is the lowest positive voltage at which the layer emits light. The relatively high voltage portion is preferably greater than 4V, and most preferably greater than 6V. The voltage is preferably sufficient for the device to appear to the eye of a user to give a substantially continuous light output. The relatively high positive voltage is preferably in the range from 1 to 200V.

The off time during the drive scheme cycle is preferably sufficiently short for the device to appear to the eye of a user to give a substantially continuous light output.

The relatively low voltage portion may comprise a portion (in particular an non-instantaneous portion) of zero or substantially zero voltage and/or a portion of negative voltage. The relatively low voltage portion may comprise two or more constant voltage portions each of different voltages. At least one of these voltages is suitably a negative voltage. The amplitude of the negative voltage may be greater than that of the positive voltage, suitably at least 1.5, 2 or 3 times the amplitude of the positive voltage. Alternatively the amplitude of the negative voltage may be less than that of the positive voltage, in which case the amplitude of the positive voltage is suitably at least 3, 4 or 5 times the amplitude of the negative voltage. The amplitude of the negative voltage is suitably in the range from 0.1V to 200V, preferably from 1V to 200V.

The duration of the relatively low voltage portion (and especially any negative voltage portion of that) may be greater than or less than the duration of the relatively high voltage portion. The durations of the portions and their voltage profiles may be selected so that the integrated voltage of the drive scheme over time is zero or substantially zero and/or so that the integrated injected current of the drive scheme over time is zero or substantially zero and/or so that the integrated injected power of the drive scheme over time is minimised or substantially minimised. Instead of selecting any or all of these parameters to be zero they could be minimised or substantially minimised whilst maintaining adequate light output from the device and/or apparently continuous light output from the device and/or whilst maximising the expected time to failure of the device. The drive scheme preferably comprises repeating a cycle of the relatively high and relatively low voltages portions. Any or all of the parameters mentioned above are preferably set to zero or substantially zero or minimised over one such cycle.

One or both of the anode and the cathode is preferably continually connected to the drive means throughout the drive scheme. Alternatively, at least one of them could be periodically disconnected from the drive means, as during the multiplexing of a matrix display.

The drive scheme is preferably cyclical. It preferably comprises repeating a cycle of the positive, negative and substantially zero voltage portions. The cycle preferably includes a negative voltage portion immediately followed bat a positive voltage portion. The cycle preferably includes a positive voltage portion immediately followed by a portion of substantially zero voltage immediately followed by a positive voltage portion. The cycle preferably includes a negative voltage portion immediately followed by a portion of substantially zero voltage immediately followed by a negative voltage portion. The cycle preferably includes a first positive voltage portion immediately followed by a negative voltage portion, and a second positive voltage portion immediately preceded by a negative voltage portion. Alternatively, the drive scheme may comprise a random or pseudo-random series of pulses.

The device may also comprise a drive means for applying a further positive voltage between the anode and the cathode of a voltage less than the turn-on voltage of the polymer light-missive layer.

According to the present invention from a fourth aspect there is provided a light-emissive polymer device comprising: an anode; a cathode; a conjugated light-emissive polymer layer located between the anode and the cathode; and a driver for applying a voltage drive scheme between the anode and the cathode of a pattern having a first, preconditioning positive voltage portion of an amplitude that is insufficient to cause the polymer layer to emit light and a second, activating voltage portion of an amplitude that is sufficient to cause the polymer layer to emit light.

The preconditioning voltage portion is preferably applied before the activating voltage portion.

The organic light-emissive layer preferably comprises a luminescent material. The luminescent material is suitably a conjugated material. The organic light-emissive layer suitably comprises one or more of a conjugated polymer, an organometallic light-emissive material and a non-polymeric material such as a luminescent small molecule (see for example U.S. Pat. No. 4,539,507).

Polymeric light-emissive materials suitable for use according to this invention especially include conductive or semi-conductive polymers, for instance semiconductive conjugated polymer materials. The polymer layer preferably comprises one or more luminescent polymers, such as PPV, poly(2-methoxy-5(2'-ethyl)hexyloxyphenylene-viylene) ("MEH-PPV"), polyfluorenes, polyparaphenylenes, etc., or co-polymers thereof, and including substituted and/or unsubstituted versions thereof. It could be deposited by spin-coating, dip-coating, blade-coating, meniscus-coating self-assembly etc. The constituent of the light-emissive layer and/or its precursor is preferably soluble, most preferably in water: examples are precursor-based PPV derivatives such as MEH-PPV. The thickness of the layer is preferably in at least the range from 10 to 200 nm and most preferably around 1000 Å.

The term "conjugated" indicates a material which is partially, mostly, fully or substantially fully conjugated. It includes within its scope homopolymers and copolymers.

Suitable small molecule materials include tris(8-hydroxyquineleto)aluminium ($alq_3$) and derivatives thereof.

The anode is preferably of a high work function material, suitably with a work function greater that 4 eV and most preferably greater than 4.5 eV. The layer is preferably comprised of ITO, or a metal or alloy (e.g. gold) or a suitable conducting material such as e.g. a conducting polymer such as polystyrene sulphonic acid doped polyethylene dioxythiophene ("PEDT/PSS"), polyaniline, a doped alkylthiophene or a doped polypyrrole.

The cathode is preferably of a low work function material, suitably with a work function less than 3.5 eV and most preferably less than 3 eV. The layer may comprise a metal or alloy such as aluminium, lithium and/or calcium. The layer is preferably deposited by for example sputtering or evaporation. The cathode may be provided with a layer of a suitable electron transport material, such as polyoxadiazole, to lie between the cathode and the light-missive layer.

The device preferably comprises a conductive polymer layer between the light-emissive layer and one of the electrodes, especially if the electrode is based on indium tin oxide (ITO). The conductive polymer layer preferably is or comprises polyethylene dioxythiophene ("PEDT"), PEDT/PSS, doped polyaniline, a doped alkylthiophene and/or a doped polypyrrole. The thickness of the layer is suitably less than 200 nm, preferably less than 100 nm and most preferably less than or around 50 nm.

According to a further aspect of the present invention there is provided a method of driving an organic luminescent device by applying a drive scheme as described herein.

BRIEF DESCRIPTION OF THE DRAWINGS

The present invention will now be described by way of example with reference to the accompanying drawings, in which.

DETAILED DESCRIPTION OF THE PREFERRED EMBODIMENTS

Figure 2:
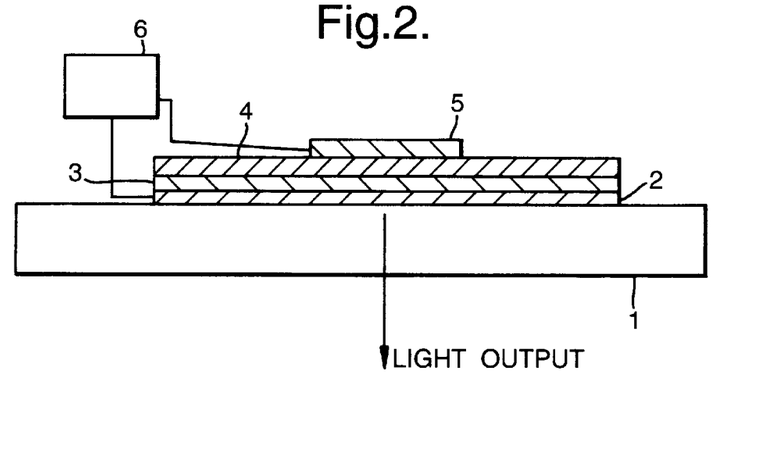
FIG. 2 shows a typical light-emissive polymer device.

FIG. 2 shows a typical light-emitting polymer device. The device has a glass sheet 1 which carries an anode layer 2 for injecting positive charge carriers, a first organic layer 3, a second organic layer 4 and a cathode 5 for injecting negative charge carriers. The anode layer is formed of indium-tin oxide ("ITO"). The first organic layer is formed of polystyrene sulphonic acid doped polyethylene dioxythiophene ("PEDT/PSS"). The second organic layer is formed of PPV. The cathode is formed of an alloy of aluminium and lithium. The device uses PPV as the light-emitting layer. The device is encapsulated in glass epoxy (not shown).

The manufacture of the device will now be described. The glass substrate is a polished glass sheet of sodalime glass 1 mm thick, with a thin barrier layer of silicon dioxide. The ITO anode is deposited on to the glass sheet by a conventional DC or RF sputtering technique. The completed ITO layer is about 1500 Å thick with a resistivity of around 30 ohm/square and a transparency of about 85%.

The PEDT/PSS is a conductive polymer which serves as a protection layer for the ITO. The PEDT/PSS mixture is prepared (see EP 0 686 662 and Bayer AG's Provisional Product Information Sheet for Trial Product AI 40711, deposited on to the ITO layer by spin coating and then heated for 1 hour at 110° C. in a nitrogen atmosphere. The thickness of the completed PEDT/PSS layer is around 500 Å. The PEDT/PSS layer could be omitted provided the resulting device had the required stability and current/voltage performance.

The PPV is then deposited over the PEDT/PSS layer. A precursor polymer, typically a precursor to a homopolymer PPV with a tetrahydrothiophene leaving group (attached to the vinylene group) or a copolymer containing in addition non-leaving acetate groups (attached to the vinylene group) is deposited on to the PEDT/PSS by spin-coating. This is then converted at 150° C. in nitrogen for four hours. The solubilising group that is removed during conversion is tetrahydrothiophene and the counter ion to the thiophenium salt is bromide. The completed PPV film is around 100 Å thick.

The cathode is an aluminium/lithium alloy containing between 0.01 and 100% lithium by weight. A preferred proportion is 2.5% Li by weight. The cathode is sputtered on to the organic PPV layer to a thickness of 1200 Å. The cathode could be made of other metals or alloys, especially ones having a low work function, for example, calcium.

To operate the device a voltage source 6 is connected between the anode and the cathode. When a suitable positive voltage is applied, so that the anode is at a sufficiently higher potential than the cathode, light is emitted by the device. The device is capable (for a copolymer PPV device) of an efficiency of around 21 m/W and a DC peak brightness of several thousand $cd/m^2$.

The voltage source 6 is capable of applying a variety of alternating drive schemes to the device, and several of these will now be described in detail.

Figure 3:
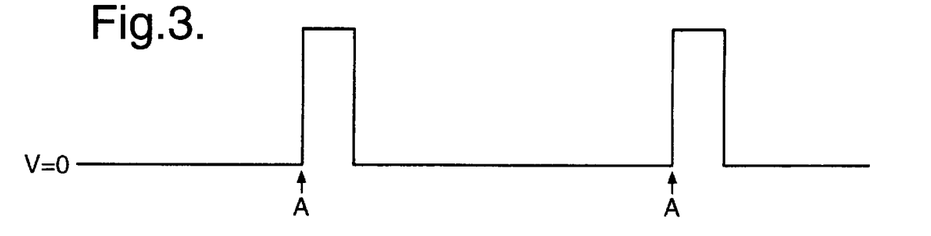
FIGS. 3 to 6 show plots of voltage against time for examples of drive schemes (the marks A indicate the beginning/end of a repeated cycle in the schemes)

FIG. 3 shows one alternating drive scheme. The scheme provides a series of positive (forward bias) pulses (applied to the anode relative to the cathode) separated by periods when no voltage is applied. To achieve the same light output although the forward voltage is applied for a shorter time it is necessary to increase the applied forward voltage and thus increase the peak light output. As well as in an individual display device (with unpatterned electrodes) which is connected continuously to the voltage driver 6 in use, this scheme may also be used for driving pixels of a matrix display, where the voltage driver is connected to a pixel (of an overall display having patterned electrodes) only intermittently, when the pixel's row is scanned. During the zero voltage periods pixels other rows of the display could be addressed.

Figure 4:
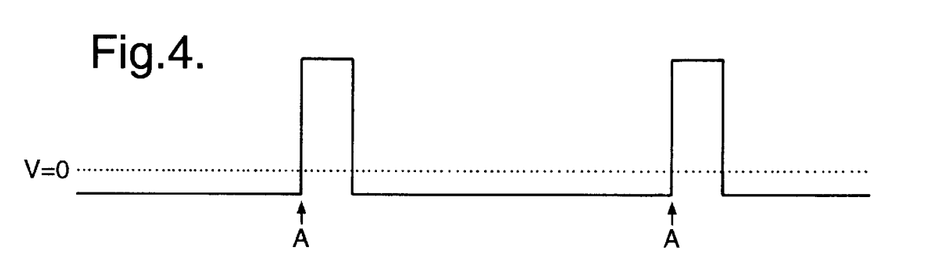

FIG. 4 shows an alternative drive scheme. As will be described in more detail below, the applicant has found that a scheme of this type car improve device life-time, for the same light output, compared to prior art schemes in which a forward voltage is applied continuously to the device. In this drive scheme there is a series of positive pulses separated by negative (reverse bias) pulses. The positive and negative pulses follow each other directly: each negative pulse begins immediately after the preceding positive pulse, and each positive pulse begins immediately after the preceding negative pulse. The applied voltage is only zero for instantaneous periods when the leading and trailing edges of the pulses pass through zero volts; there is no prolonged period during the drive scheme when the drive voltage is zero.

Figure 5:
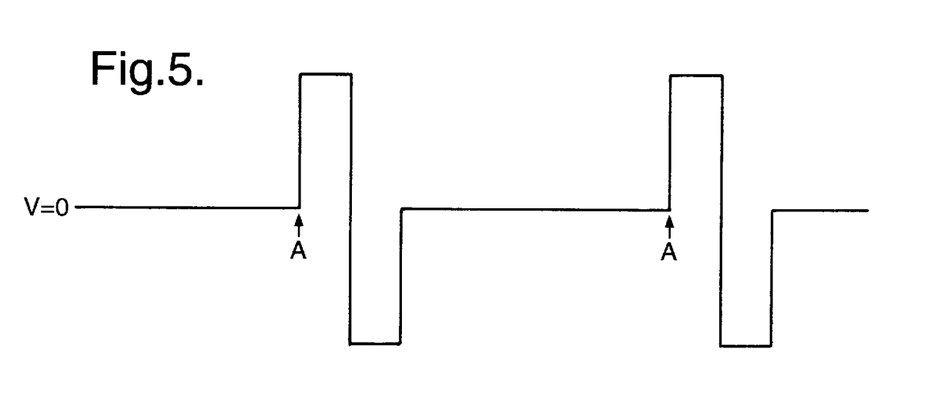

FIG. 5 shows another AC drive scheme. As will be described in more detail below, the applicant has found that a scheme of this type can improve device life-time, for the same light output, compared to prior art schemes in which a forward voltage is applied continuously to the device. In this drive scheme there is a series of positive pulses separated by negative pulses and periods of zero drive voltage. Between each positive pulse there is one negative pulse and one zero period. Each negative pulse begins immediately after the preceding positive pulse, earth zero period begins immediately after the preceding negative pulse and each positive pulse begins immediately after the preceding prolonged zero period. If this scheme is used for a pixel in a multiplexed matrix display then during the zero voltages periods pixels of the other rows of the display could be addressed.

Figure 6:
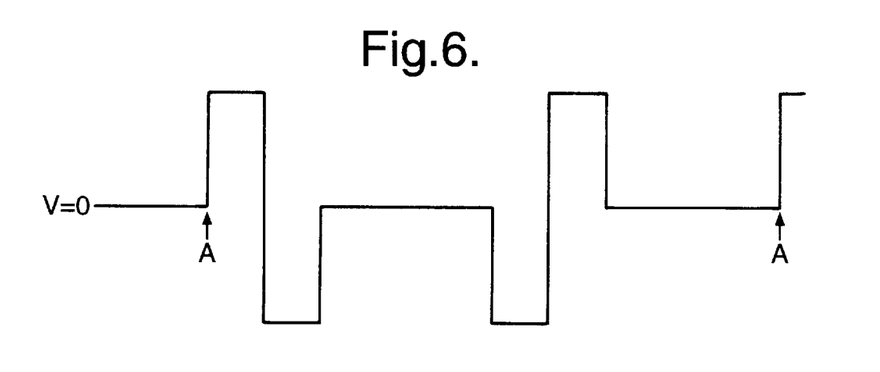

FIG. 6 shows a reverse bipolar AC drive scheme. Compared to the scheme of FIG. 5, in this scheme the order of alternate positive and negative pulse pairs is reversed. One full cycle of this scheme includes two positive pulses; therefore, the full cycle may be considered to correspond to two cycles of the schemes of FIGS. 3 to 5, as will be discussed below. One positive pulse is separated from the next positive pulse by a zero period. That positive pulse is separator from the next by a negative pulse followed by a zero period followed by a negatives pulse. Therefore, a full cycle of this drive scheme provides the following features following immediately after each other: a positive pulse, a period of zero drive voltage, a positive pulse, a negative pulse, a period of zero drive voltage and a negative pulse. If this scheme is used for a pixel in a multiplexed matrix display then during the zero voltage periods pixels of the other rows of the display could be addressed.

In the AC drive schemes of FIGS. 3 to 6 the parameters of the drive scheme can be selected to provide the desired performance as regards both light emission and device life-time. The parameters can be characterised generally as the heights of the positive pulses and (where present) negative pulses, their durations and shapes and the durations of any zero periods.

One general aim is that the light output from the device should appear to a viewer to be continuous. This normally requires a positive pulse frequency of greater than around 10 Hz. Typical frequencies are in the range from 10 Hz to 1 MHz.

Another general aim is that there should be an adequate level of light emitted from the device. FIG. 1 shows that output light intensity increases as the applied positive voltage increases. Therefore, shorter positive pulses may call for higher positive pulse voltages. Typical positive pulse voltages are in the range from 3V to 200V. By varying the duty cycle of the drive scheme these variable drive schemes may be used to provide grey-scale capabilities to a display device.

When a drive scheme is being used to drive a matrix display if the type described above then the number of rows (or columns) may influence the ratio between the width of the pulses applied to one pixel/device and the total cycle time. For the scheme of FIG. 3, the ratio of the width of the positive pulses to the total cycle time may be equal to the ratio of 1 to the number of rows of the display. The schemes of FIGS. 5 and 6 can also be used in driving a matrix display. In those cases, other pixels can be driven during the zero voltage period. Therefore, the ratio of the total length of a pair of adjacent positive and negative pulses to the cycle time (or for the scheme of FIG. 6 to half the true cycle time) may be equal to the ratio of 1 to the number of rows of the display. For the scheme of FIG. 6, a pixel may be driven first by a forward bipolar arrangement (a positive pulse followed by a negative pulse) and on the next scan of the display by a reverse bipolar arrangement (a negative pulse followed by a positive pulse).

Figure 7:
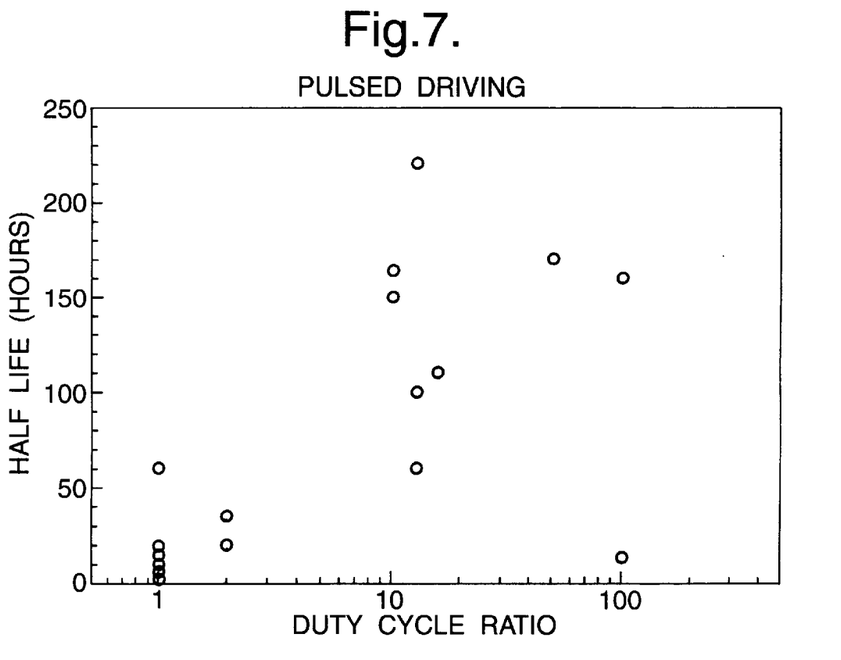
FIG. 7 shows a plot of device half-life against duty cycle ratio (i.e. the ratio of positive pulse width to total cycle time) for a set of organic light-emitting polymer devices.
Figure 8:
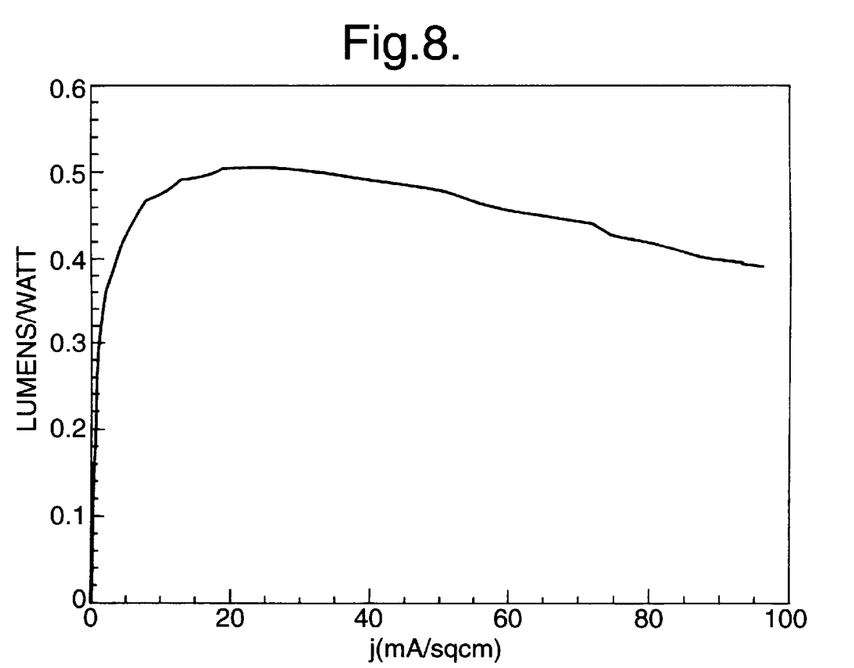
FIG. 8 plots the efficiency of a typical organic light-emitting polymer device against applied current density, FIG. 9 plots the efficiency of the device of FIG. 8 against applied voltage.
Figure 9:
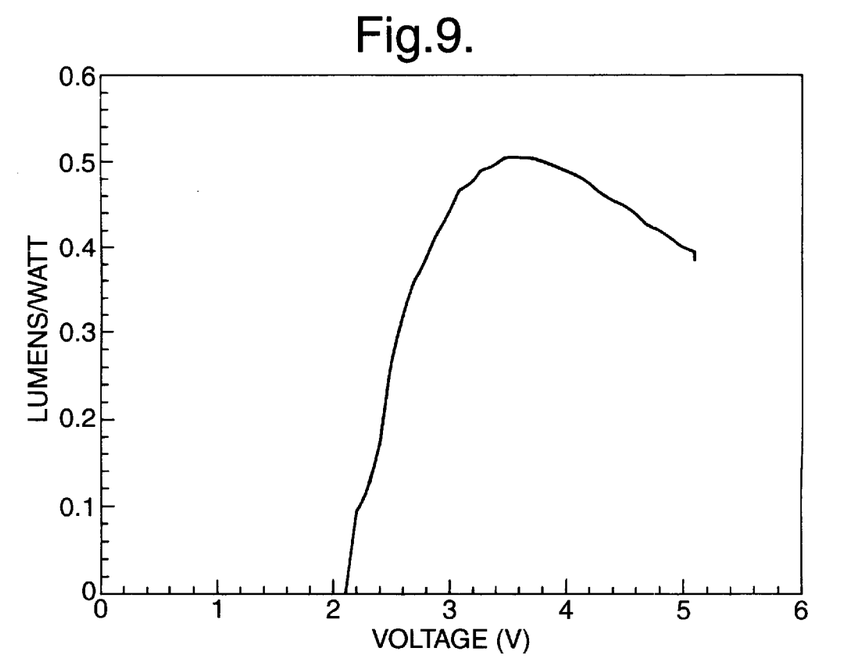
Figure 10:
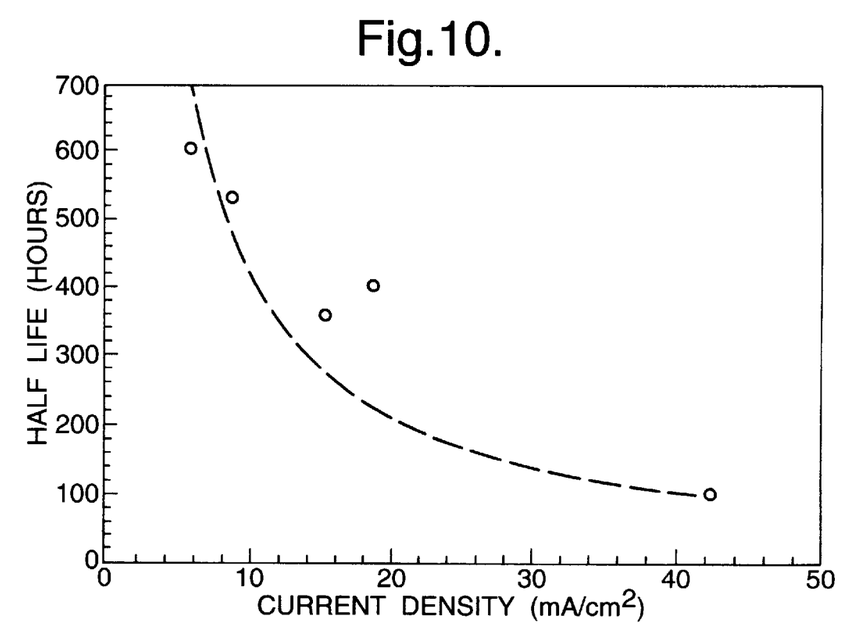
FIG. 10 shows a plot of device half-life against average applied current density for a set of devices of the type shown in FIG. 2.

The applicant has found that using alternating drive schemes can be advantageous for applications other than matrix displays. The pulse widths and duty cycle ratio may be selected with the aim of extending or maximising the operating lifetime of the device. This may be done by reducing or minimising the integrated injected current over time and/or the integrated power over time applied to the device, whilst maintaining adequate light output from the device. FIG. 7 shows a plot of device half-life against duty cycle ratio (i.e. the ratio of positive pulses width to total cycle time) for a set of conjugated light-emitting polymer devices. Surprisingly, pulsed driving appears to provide a significant increase in the life-time of the devices. One potential explanation for this is believed to rest on the improved efficiency of the device under pulsed operation as sampling a more efficient part of the device characteristic. FIG. 8 plots the efficiency of a typical organic light-emitting polymer device against applied current density. FIG. 9 plots the efficiency of the device against applied voltage. To achieve a given average light output for pulsed rather than continuous operation requires a higher operating voltage and higher peak current density. However, FIGS. 8 and 9 show that under such drive parameters the efficiency of the device is higher. Therefore, the total integrated charge required to produce the same light output can be less under pulsed rather than constant drive, and FIG. 10 shows that the operating life-time of one device of the type shown in FIG. 2 is greater for lower average current densities. There may also be other effects at work, for instance voltage-related degradation effects such as the drift of impurities to the interfaces and electrochemical effects.

The applicant has found that drive schemes that include negative pulses provide an additional means of extending the life-time of light-emitting devices. It is believed that in these schemes the negative pulse may be used to counter ion migration within the display device. Therefore, the parameters of the drive scheme may be selected so that the integrated injected voltage and/or integrated injected current and/or integrated electrical power over time for one cycle of the drive scheme is minimised, whilst maintaining adequate light output from the device.

In the bipolar drive scheme of FIG. 4, the negative pulse is of a long duration relative to the positive pulse but of a lower voltage. This scheme can provide a low integrated current over time. The product of the positive pulse voltage and the positive pulse duration is approximately equal to the product of the negative pulse voltage and the negative pulse duration. This scheme can be advantageous if the device does not tolerate a high reverse bias. However, it is not generally suitable for matrix applications because minimising the negative voltage does provide for a prolonged zero voltage period during which the drive 6 can tee disconnected from one pixel and other pixels then addressed and driven.

Another specific bipolar strategy is to provide a negative pulse that is of a short duration relative to the positive pulse but of a higher voltage. Again, the product of the positive pulse voltage and the positive pulse duration may be approximately equal to the product of the negative pulse voltage and the negative pulse duration. Now a zero voltage period can be provided too, and because the negative pulse is short it allows a pixel in a matrix display to emit light (during the positive pulse) for the majority of the scan time allotted to it. The applicant has found this scheme to be surprisingly successful for improving the life-time of light-emitting polymer devices.

Negative voltages may typically be in the range from 1V to 200V and may occupy from 9999/10000 to 1/10000 of the cycle time.

Figure 11:
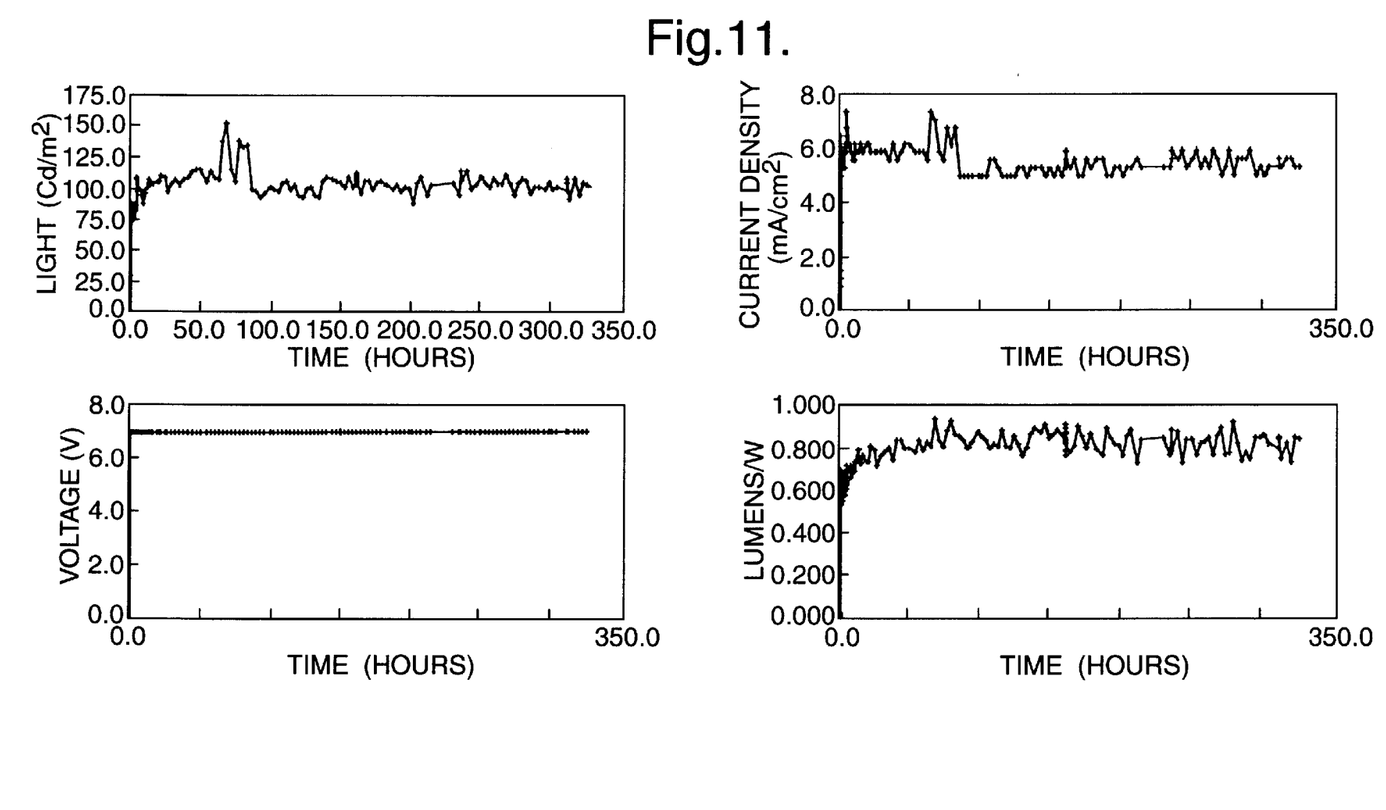
FIG. 11 plots light output, applied current density, applied voltage and efficiency all over time for a test of a device of the type shown in FIG. 2 driven by the scheme of FIG. 6 with a 1:10 duty cycle.

The applicant has found the bipolar scheme of FIG. 5 to be surprisingly successful for improving the lifetime of organic light-emitting devices, especially light-emitting organic polymer devices. FIG. 11 shows the results of a test of a device of the type shown in FIG. 2 driven by the scheme of FIG. 5 with the detailed parameters for that scheme that are listed below.

The reverse bipolar scheme of FIG. 6 may provide additional improvement of lifetime. It is believed that the asymmetry of the scheme over time, with positive pulses being alternately preceded and then succeeded by negative pulses imposes less stress on the devices and reduces differential heating effects.

Another advantage of the scheme of FIG. 6 is that it allows cross-talk between pixels of a matrix organic light-emitting display to be reduced. Using this scheme the column electrodes of the display can apply drive schemes to adjacent pixels that are out of phase by half a cycle. One pixel of a row receives a positive and then a negative pulse whilst the adjacent pixel receives a negative and then a positive pulse.

In some circumstances it may be valuable to randomise the sequence of positive, negative and zero portions of a drive scheme. Therefore, a drive scheme could comprise a random or pseudo-random sequence of portions. The scheme need not be cyclical—although it could be composed of repeated randomised blocks it could alternatively be entirely randomised. This could help to reduce factors such as charge build-up even further.

As examples specifically suitable for the device of FIG. 2, the following parameters could be used for the drive schemes of FIGS. 3 to 6:

FIG. 3

Peak positive voltage: 7V

Positive pulse width: 0.5 ms

Zero voltage time between positive pulses: 9.5 ms

Cycle time: 10 ms

FIG. 4

Peak positive voltage: 7V

Peak negative voltage: −0.37V

Positive pulse width: 0.5 ms

Negative pulse width: 9.5 ms

Zero voltage time between positive pulses: 0

Cycle time: 10 ms

FIG. 5

Peak positive voltage: 7V

Peak negative voltage: −7V

Positive pulse width: 0.5 ms

Negative pulse width: 0.5 ms

Zero voltage time between positive pulses: 9 ms

Cycle time: 10 ms

FIG. 6

Peak positive voltage: 7V

Peak negative voltage: −7V

Positive pulse width: 0.5 ms

Negative pulse width. 0.5 ms

Mean zero voltage time between positive pulses: 3 ms

Mean cycle time for positive pulses: 10 ms

Total cycle time: 20 ms

A variant of the scheme of FIG. 6 adapted to reduce the negative pulse time could be as follows:

Peak positive voltage: 7V

Peak negative voltage: −20V

Positive pulse width: 0.74 ms

Negative pulse width: 0.26 ms

Mean zero voltage time between positive pulses: 9 ms

Mean cycle time for positive pulses: 10 ms

Total cycle time: 20 ms

For organic light-emitting devices (including conjugated or partially conjugated polymer devices) that need to be switched on rapidly, for instance pixels of a matrix display, another useful drive scheme is as follows. An initial "pre-conditioning" voltage of a level just below that needed to turn the device on is applied before the device is to be turned on. Then, an additional "select" voltage is applied and superimposed on the pre-conditioning voltage to turn on the device. For example, the initial voltage could be 2V and the additional voltage 5V, making the total voltage applied to the device 2V followed by 7V. This approach can be combined with the schemes discussed above.

The pulses illustrated in FIGS. 3 to 6 are of a square-wave shape. Other shapes could be used, provided adequate device performance is maintained. Examples are sine waves, waves with sloped trailing and/or leading edges and combinations of wave shapes. For schemes that include positive and negative pulses the positive and negative pulses (or at least adjacent positive and negative pulses) may advantageously be of the same shape, although inverted.

The present invention may include any feature or combination of features disclosed herein either implicitly or explicitly or any generalization thereof irrespective of whether it relates to the presently claimed invention. In view of the foregoing description it will be evident to a person skilled in the art that various modifications may be made within the scope of the invention.

We claim:

1. A light-emissive polymer device comprising:

an anode;

a cathode;

a conjugated light-emissive polymer layer located between the anode and the cathode; and a driver for applying a voltage drive scheme between the anode and the cathode of a pattern having a relatively high voltage portion which causes the polymer layer to emit light and a relatively low voltage portion during which substantially no light is emitted by the polymer layer, the relatively low voltage portion including at least two constant voltage portions, having different voltage levels.

2. A light-emissive polymer device as claimed in claim 1, wherein the relatively low voltage portion includes a portion of substantially zero voltage.

3. A light-emissive polymer device as claimed in claim 1, wherein the relatively low voltage portion includes a portion of negative voltage.

4. A light-emissive polymer device as claimed in claim 3, wherein a peak amplitude of the negative voltage is greater than a peak amplitude of the relatively high voltage portion.

5. A light-emissive polymer device as claimed in claim 4, wherein a duration of the portion of negative voltage is less than a duration of the relatively high voltage portion.

6. A light-emissive polymer device as claimed in claim 3, wherein a peak amplitude of the negative voltage is less than a peak amplitude of the relatively high voltage portion.

7. A light-emissive polymer device as claimed in claim 6, wherein a duration of the portion of negative voltage is greater than a duration of the relatively high voltage portion.

8. A light-emissive polymer device as claim 1, wherein the drive scheme comprises repeating a cycle of the relatively high and relatively low voltage portions.

9. An organic light-emissive device comprising:

an anode;

a cathode;

an organic light-emissive layer located between the anode and the cathode; and a driver For applying a voltage drive scheme between the anode and the cathode of a pattern having a positive voltage portion which causes the organic layer to emit light, a negative voltage portion of substantially constant voltage, during which substantially no light is emitted by the organic layer, and a portion of substantially zero voltage during which substantially no light is emitted by the organic layer.

10. An organic light-emissive device as claim 9, wherein the drive scheme comprises repeating a cycle of the positive, negative and substantially zero voltage portions.

11. An organic light-emissive device as claimed in claim 10, wherein the cycle includes a negative voltage portion immediately followed by a positive voltage portion.

12. An organic light-emissive device as claimed in claim 10, wherein the cycle includes a positive voltage portion immediately followed by a portion of substantially zero voltage immediately followed by a positive voltage portion.

13. An organic light-emissive device as claimed in claim 10, wherein the cycle includes a negative voltage portion immediately followed by a portion of substantially zero voltage immediately followed by a negative voltage portion.

14. An organic light-emissive device as claimed in claim 10, wherein the cycle includes a first positive voltage portion immediately followed by a negative voltage portion, and a second positive voltage portion immediately preceded by a negative voltage portion.

15. An organic light-emissive device as claimed in claim 9, comprising a drive means for applying a further positive voltage between the anode and the cathode of a voltage less than a turn-on voltage of the organic light-emissive layer.

16. A method of operating a light emissive device, comprising:

applying a relatively high voltage across an anode and a cathode having a conjugated light-emissive polymer material electrically connected therebetween, causing the polymer material to emit light;

applying a first relatively low voltage, of insufficient voltage to cause the polymer material to emit light, across the anode and cathode; and applying a second relatively low voltage, of insufficient voltage to cause the polymer material to emit light and different from the first relatively low voltage, across the anode and cathode;

wherein the first and second relatively low voltages are each substantially constant.

17. A method as claimed in claim 16, wherein applying a first relatively low voltage includes applying approximately zero voltage across the anode and electrode.

18. A method as claimed in claim 16, wherein applying a second relatively low voltage includes applying a voltage of opposite polarity from the relatively high voltage.

19. A method as claimed in claim 18, wherein a peak amplitude of the second relatively low voltage is greater than a peak amplitude of the relatively high voltage.

20. A method as claimed in claim 19, further comprising applying the relatively high voltage for a first duration and applying the second relatively low voltage for a second duration shorter than the first duration.

21. A method as claimed in claim 18, wherein a peak amplitude of the second relatively low voltage is smaller than a peak amplitude of the relatively high voltage.

22. A method as claimed in claim 21, further comprising applying the relatively high voltage for a first duration and applying the second relatively low voltage for a second duration longer than the first duration.

* * * * *